United States Patent [19]
Hattori et al.

[11] Patent Number: 5,673,477
[45] Date of Patent: Oct. 7, 1997

[54] METHOD OF FABRICATING PROBE UNIT

[75] Inventors: Shigeo Hattori; Toshiaki Yutori; Nobuhiro Hara; Kunihiko Nishioka; Masahiko Uchimura; Toshiaki Okumura; Masakazu Nakao, all of Kobe, Japan

[73] Assignee: Kabushiki Kaisha Kobe Seiko Sho, Kobe, Japan

[21] Appl. No.: 593,550

[22] Filed: Jan. 30, 1996

Related U.S. Application Data

[62] Division of Ser. No. 244,383, filed as PCT/JP93/01458, Oct. 12, 1992, published as WO94/09374, Apr. 28, 1994, abandoned.

[30] Foreign Application Priority Data

| Oct. 12, 1992 | [JP] | Japan | 4-272862 |
| Oct. 12, 1992 | [JP] | Japan | 4-272863 |
| Oct. 12, 1992 | [JP] | Japan | 4-272864 |
| Oct. 12, 1992 | [JP] | Japan | 4-272865 |
| Oct. 20, 1992 | [JP] | Japan | 4-281938 |
| Oct. 27, 1992 | [JP] | Japan | 4-288785 |
| Jan. 26, 1993 | [JP] | Japan | 5-010698 |
| Apr. 19, 1993 | [JP] | Japan | 5-091412 |

[51] Int. Cl.$^6$ ........................ H01R 43/00
[52] U.S. Cl. .................. 29/825; 29/826; 324/762
[58] Field of Search .............. 29/826, 825, 884; 324/754, 757, 762

[56] References Cited

U.S. PATENT DOCUMENTS

| 3,194,931 | 7/1965 | Plasko et al. | 29/826 X |
| 3,274,368 | 9/1966 | De Boo et al. | 29/826 X |
| 3,488,842 | 1/1970 | Rochette et al. | 29/826 |
| 3,702,439 | 11/1972 | McGahey | 324/757 |
| 3,733,573 | 5/1973 | Dieterich | 29/826 X |
| 3,766,646 | 10/1973 | Froebe et al. | |
| 4,777,720 | 10/1988 | Maier et al. | 29/826 |
| 5,151,653 | 9/1992 | Yutori | 324/754 |
| 5,214,375 | 5/1993 | Ikeuchi | 324/754 |

*Primary Examiner*—Carl J. Arbes
*Attorney, Agent, or Firm*—Oblon, Spivak, McClelland, Maier & Neustadt, P.C.

[57] ABSTRACT

A probe unit comprising a base in the form of a rectangular plate and a plurality of ultrathin metal wires which are partially secured to the base at a given pitch. Each of the wires comprises a straight portion firmly secured to the base, a bent portion located on an extension of the straight portion, and an inclined portion inclined from the bent portion outwardly of the base toward an inspected surface of an object to be inspected, and an R-shaped portion extending from the front end of the inclined portion outwardly of the base. The bent portion protrudes outwardly from the base and is bent toward the inspected surface. The R-shaped portion forms each probe pin bearing against the inspected surface.

28 Claims, 16 Drawing Sheets

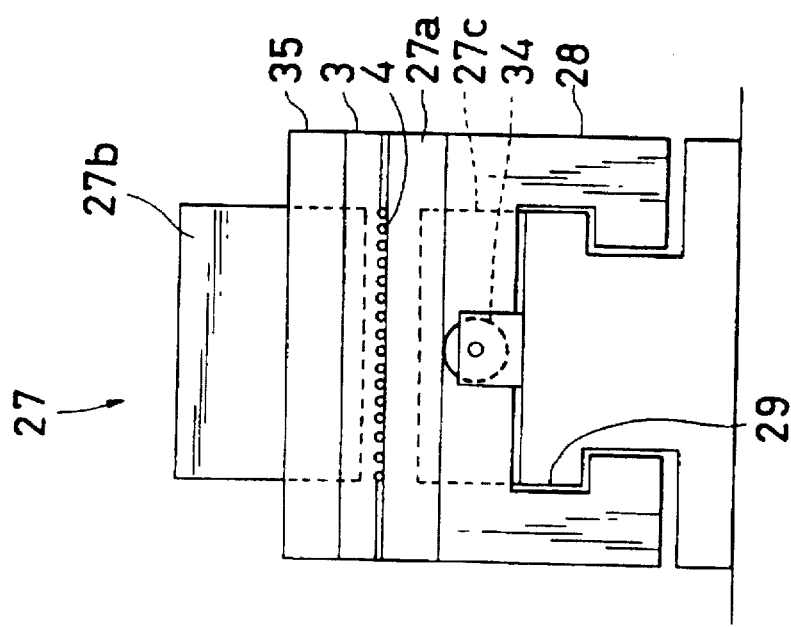
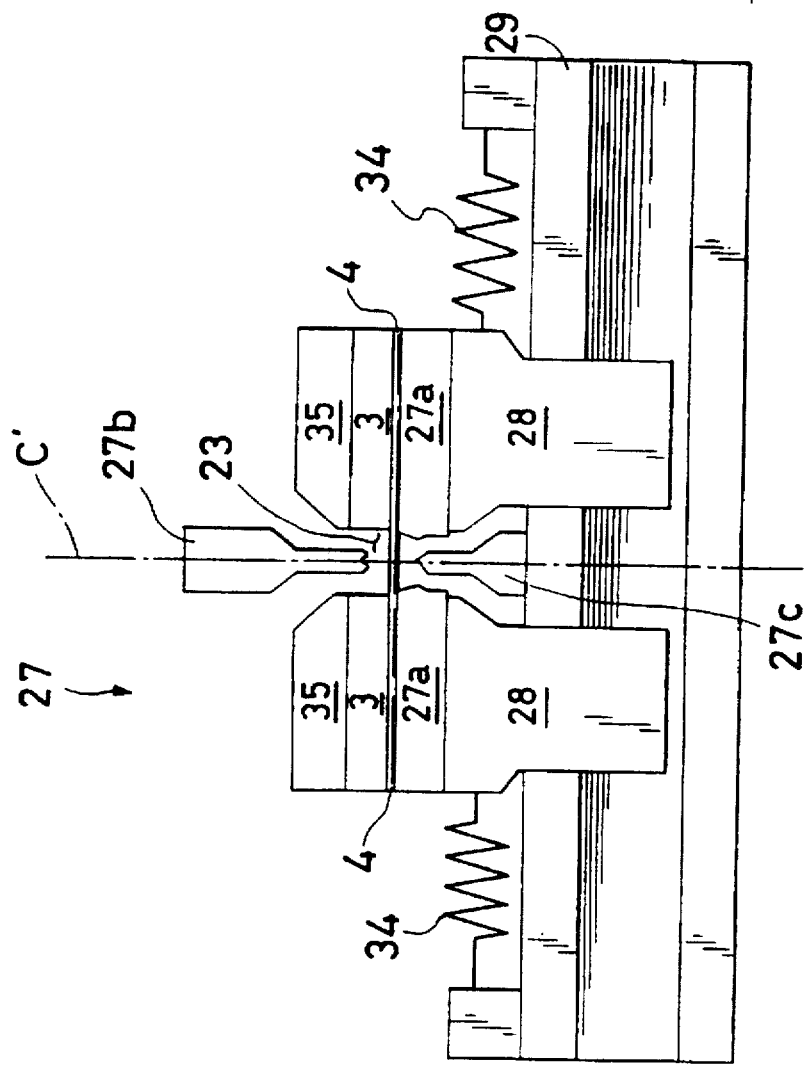
Fig.13(a)
Fig.13(b)

5,673,477

1

METHOD OF FABRICATING PROBE UNIT

This application is a division of application Ser. No. 08/244,383, filed on Jul. 28, 1994, now abandoned, which is a 371 of PCT/JP93/01458, filed on Oct. 12, 1993.

TECHNICAL FIELD

The present invention relates to a probe unit used for an apparatus which is employed to inspect a conductive interconnection pattern formed, for example, on a liquid-crystal substrate or on a semiconductor substrate for electrical conduction and, more particularly to a method of fabricating a probe unit designed to cope with conductive interconnects formed at a high density.

BACKGROUND ART

The prior art probe unit used to inspect conductive interconnects on a substrate for electrical conduction comprises a base in the form of a rectangular plate and extremely thin metal wires for a plurality of probe pins (contact elements for inspection) attached on the base at regular intervals. Each of the extremely thin metal wires is composed of a mounting portion in the form of a clamp and a straight portion. The mounting portion is in engagement with the opposite sides of the base. The straight portion extends outwardly of the base toward an inspected surface of an object to be inspected from the ends of the clamp-shaped mounting portion which extends along the surface of the base facing the inspected surface. The front end of this straight portion forms a probe pin (a contact element for inspection) which bears on the inspected surface of the inspected object.

Therefore, the extremely thin metal wires for forming the probe pins are bent in the manner described now. When the clamp-shaped mounting portion is formed, each wire is bent along the ends of the base toward the base. When the straight portion becoming a probe pin is formed, each wire is bent outwardly of the base toward the inspected surface from that end of the mounting portion which extends along the base surface facing the inspected surface.

The probe unit described above inspects each conductive interconnect for electrical conduction by bringing the probe pins into abutting engagement with the inspected numerous conductive interconnects, respectively, on the substrate. Each probe pin of the prior art probe unit is so formed that the clamp-shaped mounting portion and the straight portion together exhibit self-resilience, the straight portion extending from the end of the mounting portion toward the inspected surface of the inspected object outwardly of the base. This prevents the probe pins from making nonuniform abutting engagement with the conductive interconnects.

Electrical conduction of conductive interconnects on a liquid-crystal substrate is inspected, using such a probe unit. When an appropriate voltage is applied across the liquid crystal, its transmissivity or reflectivity is varied. The liquid-crystal substrate is used as a display, making use of this phenomenon. Liquid-crystal displays have found wide acceptance as watches, clocks, pocket calculators, displays for personal computers, displays for wordprocessors, and the viewing screens of portable TV sets. In recent years, displays having higher image quality have tended to be fabricated. To cope with this trend, the number of pixels on liquid-crystal substrates has been increased. In recent years, liquid-crystal substrates having 100–200 thousands of pixels or liquid-crystal substrates having even 300 thousands of pixels have been developed. It is expected that liquid-crystal substrates having as many as 800–3000 thousands of pixels will be developed in the near future. As the number of pixels is increased in this way, the linewidth of conductive interconnects on liquid-crystal substrates and the pitch between the interconnects have been reduced. As a result, the density has been increased.

As the linewidth of conductive interconnects on liquid-crystal substrates and the pitch between the interconnects are decreased, it has been required that the diameter of each probe pin of a probe unit and the pitch between the probe pins be reduced. The probe unit performs an electrical conduction test on each conductive interconnect formed on a substrate at a high density. The probe pins bear against the conductive interconnects. In order to manufacture a probe unit satisfying this requirement, it is necessary to array ultrathin metal wires for probe pins at regular intervals precisely so that the probe pins do not interfere with each other even if the pitch between the probe pins is small. Also, it is necessary that a bending operation for forming each ultrathin metal wire for each probe pin be carried out more precisely and that the conductive interconnect-bearing portions of the probe pins be spaced from each other at an accurate pitch.

However, for the prior art probe unit, the ultrathin metal wires for forming probe pins have been already bent along the ends of the substrate and so the presence of the ends of the base hinders bending the metal wires for the probe pins so accurately that the conductive interconnect-bearing portions of the straight portions of the metal wires are spaced from each other at a given pitch. The ends of the base have made it difficult to improve the accuracy of the pitch between the straight portions forming the probe pins in the positions of the conductive interconnect-bearing portions.

The present invention has been made in view of the foregoing problems with the prior art techniques. It is an object of the invention to provide a probe unit having probe pins whose diameter and pitch can be reduced, the probe pins having conductive interconnect-bearing portions which can be arranged at an improved pitch. Also, it is an object of the invention to provide a method of manufacturing such a probe unit.

DISCLOSURE OF INVENTION

An inventive probe unit achieving the above objects comprises a base in the form of a rectangular plate and ultrathin metal wires for probe pins. The wires are regularly spaced from each other and partially firmly secured to the base. Each wire comprises a straight portion rigidly fixed to the base, a bent portion, an inclined portion, and an R-shaped portion. The bent portion is located on an extension of the straight portion, protrudes outwardly from the base, and is bent toward the inspected surface of an object to be inspected. The inclined portion is bent from the bent portion toward the inspected surface of the inspected object outwardly of the base. The R-shaped portion extends from the front end of the inclined portion outwardly of the base. The R-shaped portion forms a probe pin bearing against the inspected surface of the inspected object.

If each ultrathin metal wire for a probe pin is bent so as to form the straight portion, the bent portion, the inclined portion, and the R-shaped portion, and if the probe pin is finished, then the probe pin itself has resilience. This prevents the probe pins from making nonuniform abutting engagement with the inspected surface. Each probe pin formed so as to extend away from the base makes it possible to perform the bending operations necessary for fabrication of the probe pin in positions where the presence of the ends of the base do not hinder the bending operations. Thus, an accurate bending operation can be carried out while ensuring a desired pitch between the R-shaped portions forming the probe pins in the positions of conductive interconnect-bearing portions. Hence, the accuracy of the given pitch between the probe pins in the positions of the conductive interconnect-bearing portions can be enhanced.

A method of manufacturing a probe unit according to the invention comprises: a first step for forming ultrathin metal wires for probe pins out of metal wire rods; a second step for forming two bases, each taking the form of a rectangular plate, or a mother support provided with a window becoming a desired space; a third step for disposing the two bases with the desired space therebetween or disposing the single mother support, laying the aforementioned numerous ultrathin metal wires for the probe pins across the space at a given pitch, and firmly securing the wires; a fourth step for splitting said mother support into the two bases at the given space therebetween, if said mother support is used, and then bending the ultrathin metal wires away from the base, the wires protruding from said support into the space, to form the probe pins; and a fifth step for separating the two bases from the front ends of the probe pins.

In the manufacturing method described above, each probe pin is bent in the space between the two bases and, therefore, the probe pins can be accurately bent while securing the given pitch in the positions of the conductive interconnect-bearing portions without being disturbed by the existence of the ends of the bases. For example, the ultrathin metal wires for the probe pins are bent into a desired shape by performing any one or all of a tensioning operation, a heating operation, and a diametrical compressive deformation operation. In this way, a probe unit having probe pins equipped with conductive interconnect-bearing portions arranged at an accurate pitch is manufactured. As a result, even if the pitch between the probe pins is small, the pins do not interfere with each other. Consequently, the diameter of the probe pins and the pitch between them can be reduced, the probe pins acting to perform electrical conduction tests by making abutting engagement with the conductive interconnects formed at a high density on a liquid-crystal substrate or on a semiconductor substrate.

BRIEF DESCRIPTION OF DRAWINGS

FIGS. 13a and 13b show molds used in a still other probe unit-manufacturing method according to the invention;

BEST MODE FOR CARRYING OUT THE INVENTION

The present invention is hereinafter described in detail with reference to the accompanying drawings. In the present embodiment, the present invention is applied to a probe unit used to inspect a liquid-crystal display for electrical conduction.

Figure 1:
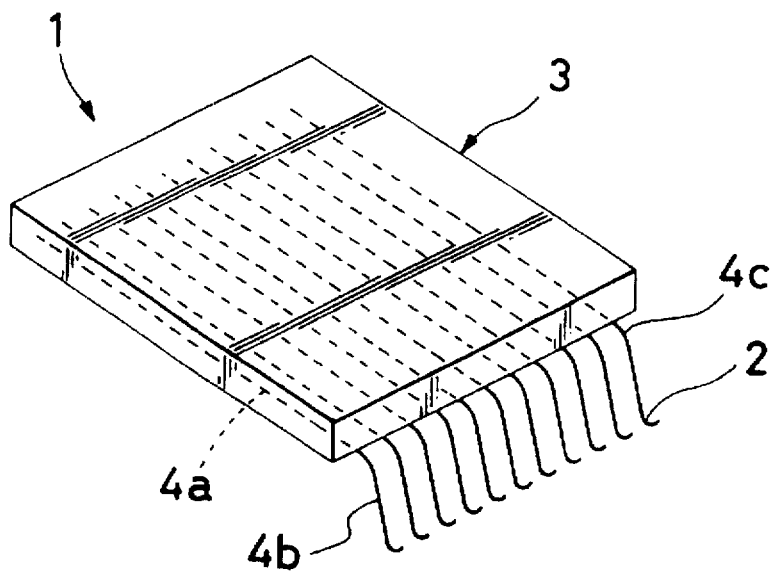
FIG. 1 is a perspective view of a probe unit according to the present invention.

FIG. 1 is a perspective view of a probe unit in the present invention. This probe unit, generally indicated by numeral 1, comprises 80 to 300 ultrathin metal wires 4 for probe pins and a base 3 made of a thermosetting resin. The diameter of each of the wires 4 is not greater than 100 μm. These wires 4 are spaced from each other at a pitch of less than 300 μm and with a pitch error of less than ±20 μm on the base 3. The base 3 is made of polycarbonate and takes the form of a rectangular plate. Polyether, ether ketone, and other insulating resin can be used as the material of the thermosetting resin base 3 instead of polycarbonate.

Figure 2:
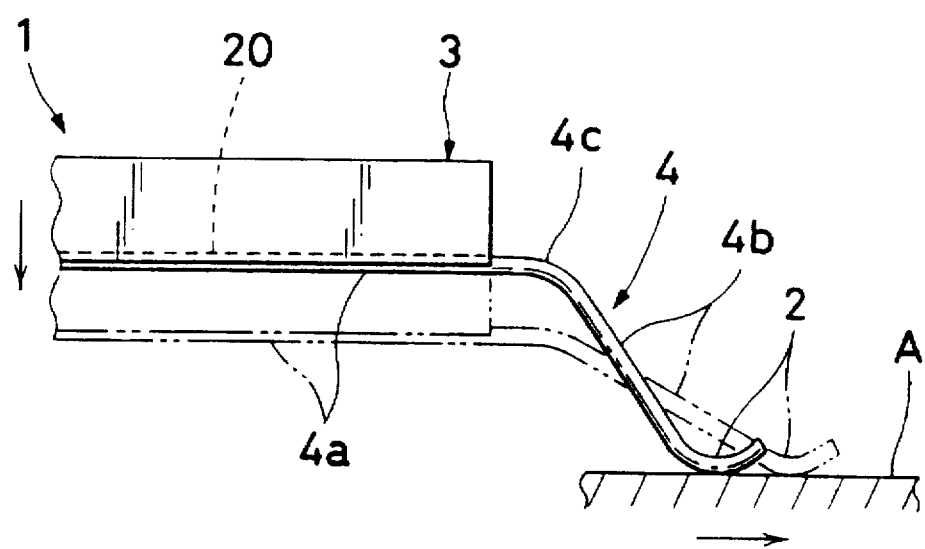
FIG. 2 is a diagram illustrating the operation of the unit shown in FIG. 1.

FIG. 2 is a fragmentary side elevation of the probe unit in the present embodiment. Each of the ultrathin metal wires 4 for the probe pins comprises a straight portion 4a rigidly fixed to the base 3, a bent portion 4c located on an extension of the straight portion, an inclined portion 4b inclined from the bent portion 4c outwardly of the base toward an inspected surface A of an object to be inspected, and an R-shaped portion 2 extends from the front end of the inclined portion 4b outwardly of the base. The bent portion 4c protrudes outward and is bent toward the inspected surface A of the inspected object. The R-shaped portion forms a probe pin 2. The inclined portion 4b is inclined at about 30degrees. The curvature radius of the R-shaped portion 2 is set to approximately 0.3 mm. Diametrically about half of the straight portion 4a of the ultrathin metal wire 4 for the probe pin is buried in a groove 20 formed in the surface of the resinous base 3 which faces the inspected surface A of the inspected object. The remaining portion is exposed to the inspected surface A. A tape (described later) or the like is bonded to this exposed portion for TAB.

The bent portion 4c is shaped so as to have a flattened cross section. This improves the rigidity in the direction of array of the ultrathin metal wires 4 for the probe pins and reduces wobbling when contact is made. Where each ultrathin metal wire 4 for a probe pin is flattened over the whole length, rolling can be prevented when it is placed on the base 3. The pitch accuracy and the workability can be improved accordingly.

The diametrical dimension of those portions of the ultrathin metal wires 4 which are buried in the resinous base 3 are not limited to about one half of the diameter. For example, the ultrathin metal wires for the probe pins may be partially buried longitudinally and the remaining portions may be exposed. The whole wires may be buried. The end surfaces opposite to the end surfaces of the ultrathin metal wires 4 on which the probe pins are formed may be exposed from the end surfaces of the resinous base 3, and a tape (described later) may be attached to these exposed portions for TAB.

Figure 3A:
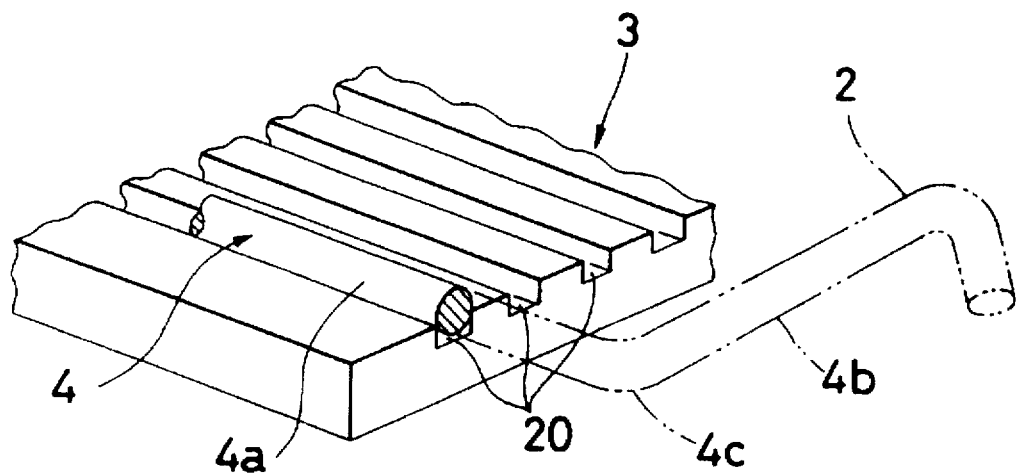
FIGS. 3a, 3b and 4 are views showing positioning grooves in ultrathin metal wires of the probe unit according to the invention, the wires being used for probe pins.
Figure 3B:
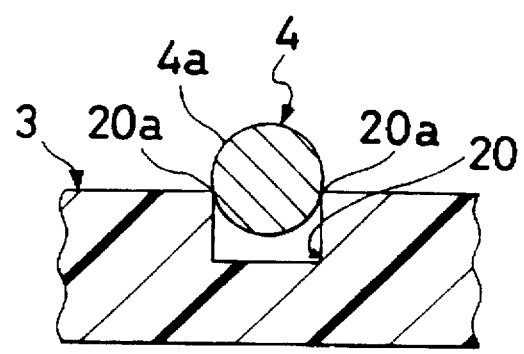
Figure 4:
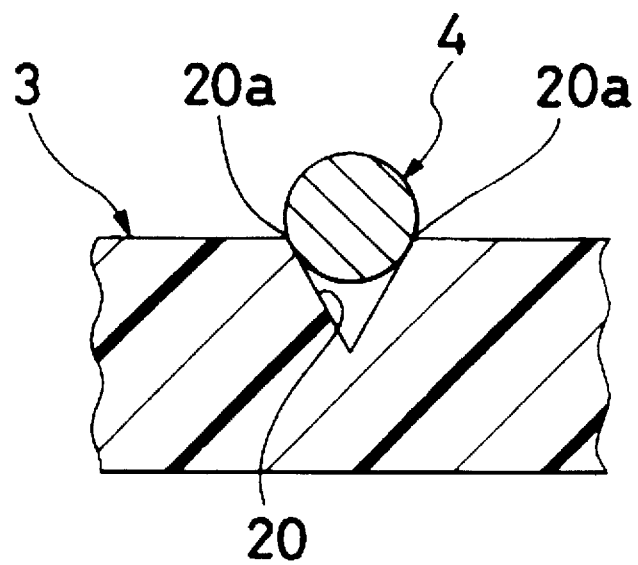

FIG. 3 shows one of the above-described grooves 20 in the base 3. The grooves 20 are formed to permit the ultrathin metal wires 4 for the probe pins to be placed in position accurately. The grooves are spaced from each other at a given pitch of less than 300 μm. The width and the depth of each groove 20 are set slightly smaller than the diameter of each metal wire 4 so that the straight portion 4a of each wire 4 is held by the both corners 20a of the groove 20. When the straight portion 4a of each ultrathin metal wire 4 is heated, the abutting portion of the resinous base 3 is melted, so that the straight portion 4a is buried in the groove 20 in the base 3, whereby the straight portion is firmly secured there. The shape of each groove 20 is not limited to the clamp-shaped form as shown in FIG. 3. It can also be a V-shaped form as shown in FIG. 4.

A tape is stuck on the exposed portions of the straight portions 4a of the ultrathin metal wires 4 for the probe pins for tape automated bonding (TAB). The tape is connected with a measuring apparatus. The tape consists of a flexible film on which a conductive pattern connected with the metal wires 4 is formed by etching or other method. The conductive pattern on the tape and the ultrathin metal wires 4 for the probe pins are connected together simultaneously in one operation by thermo-compression. What are connected with the ultrathin metal wires 4 for the probe pins of the probe unit 1 can be flexible printed circuits and glass substrates as well as the aforementioned tape for TAB.

Where substrates bonded to a tape by TAB or other method are disposed on the exposed portions of the straight portions 4a of the ultrathin metal wires 4 for the probe pins on the base 3 and the conductive interconnects on the substrates are connected with the exposed portions simultaneously, the wire-laying operation can be easily performed if the wires are thin and the pitch between them is small. The productivity can be improved compared with the conventional method in which wires are laid one by one.

Figure 5:
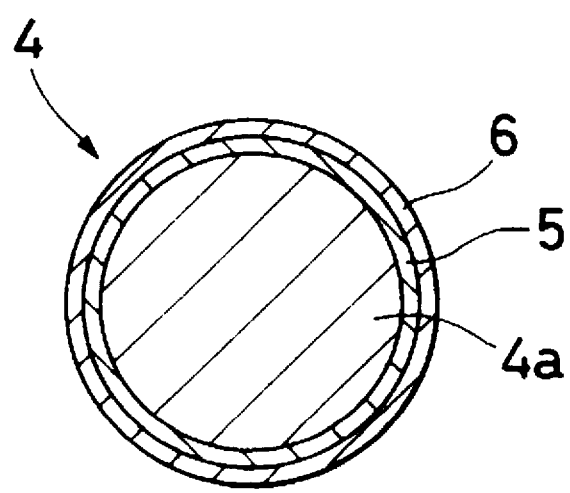
FIG. 5 is a cross-sectional view of one ultrathin metal wire for a probe pin.

FIG. 5 is a cross-sectional view of one of the ultrathin metal wires 4 for the probe pins. Each ultrathin metal wire 4 is fabricated by forming a Ni film 5 on the surface of a low-carbon two-phase composition steel wire 4a having a diameter of 20 to 100 μm by electroplating, hot dipping, or other method and forming a noble metal film 6 of Au on the surface of the Ni film 5 also by plating.

The operation and the advantages of the probe unit described above are described below. In the probe unit 1 constructed as described above, each probe pin 2 is fabricated by bending each ultrathin metal wire 4 for a probe pin into the straight portion 4a, the bent portion 4c, the inclined portion 4b, and the R-shaped portion 2, as shown in FIG. 2. Therefore, the probe pin 2 has self-resilience. When a slight load is applied in the direction indicated by the arrow, the probe pins 2 slide on the inspected surface A as indicated by the phantom lines. This prevents the probe pins 2 from making nonuniform abutting engagement with the inspected surface A. We conducted an abrasion test by causing the probe pins to slide one hundred thousands times. We observed that the sliding surface was hardly deteriorated.

The probe pins 2 formed so as to extend outwardly of the base 3 makes it possible to perform a bending operation for the formation of the probe pins 2 in positions where the ends of the base 3 do not hinder the bending operation. This enables an accurate bending operation which ensures a desired pitch between the R-shaped portions becoming the probe pins 2 in the positions of the conductive interconnect-bearing portions. Hence, the accuracy of the pitch between the probe pins 2 in the positions of the conductive interconnect-bearing portions can be improved.

One method of manufacturing the probe unit 1 described above is described now. The manufacturing method in the present example comprises: a first step for forming each ultrathin metal wire for a probe pin out of a metal wire rod; a second step for forming bases, each taking the form of a rectangular plate; a third step for laying the aforementioned numerous ultrathin metal wires for the probe pins at a given pitch on the two bases disposed with a space therebetween in the direction in which the bases are arrayed and for firmly securing the wires; a fourth step for bending each ultrathin metal wire protruding from the corresponding one of the bases into the space toward an inspected surface of an object to be inspected to form a bent portion and an inclined portion bent from the bent portion outwardly of the bases and for bending the wire from the front end of the inclined surface outwardly of the bases to form an R-shaped portion, thereby forming a probe pin; and a fifth step for separating the two bases from the front ends of the R-shaped portions of the ultrathin metal wires.

The above-described steps are described in detail below. In the first step, the Ni film 5 shown in FIG. 5 is coated on a low-carbon two-phase composition steel wire 4a by electroplating or other method. Then, the wire is cold-drawn. The Ni film 5 is subjected to plastic-working, thus imparting plastic deformation to the film. Thus, metal wire rods having a desired diameter are fabricated.

Thereafter, the noble metal film 6 is coated on the surface of each metal wire rod. This is also cold-drawn, and the noble metal film 6 is plastically deformed by plastic-working. This drawing operation is repeated until a desired diameter is obtained. In this way, ultrathin metal wires 4 used for probe pins and having diameters of less than 100 μm are obtained.

Then, each ultrathin metal wire 4 for a probe pin as described above is kept in a heating furnace for 30 minutes while stretching the wire 4. For example, the inside of the furnace is maintained at 430° C. In this way, the wire is thermally treated. Subsequently, the ultrathin metal wire 4 is wound on a bobbin. In this manner, the ultrathin metal wires 4 for probe pins are further straightened. No limitations are imposed on the temperature or retention time of the thermal treatment. Temperature and time suitable for movable of the strain produced by the processing may be set without deteriorating the intensity.

In the second step, the base 3 made of a thermoplastic resin is molded, using metallic molds provided with a number of protrusions, so that numerous grooves corresponding to the protrusions on the molds are formed on the surface of the base opposite to the inspected surface of the inspected object, as shown in FIG. 3. The grooves 20 are formed so that the pitch between the ultrathin metal wires 4 for the probe pins is made accurate. The pitch is set to a desired value of less than 300 µm. When the grooves are formed, the width and the depth of the grooves are so set that the straight portions 4a of the metal wires 4 are held in their respective grooves. Each groove in the base 3 of the thermoplastic resin may be formed into a V-shaped groove by a dicing machine or the like.

Figure 6:
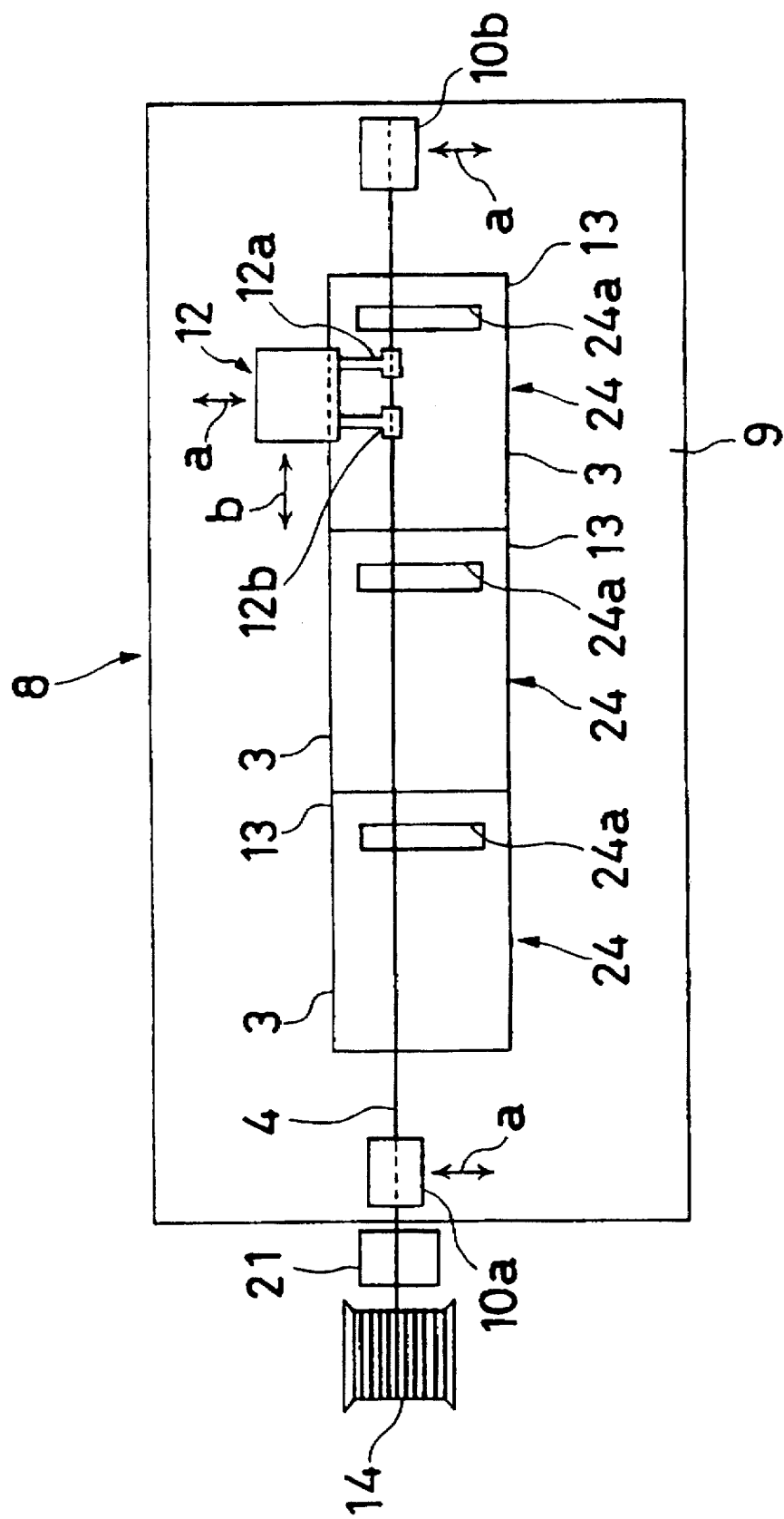
FIG. 6 is a side elevation of a wire-laying machine for use in a probe unit-manufacturing method according to the invention.

In the third step, a wire-laying machine 8 as shown in FIG. 6 is prepared. This wire-laying machine 8 comprises a rectangular stationary block 9, a pair of clamping devices 10a, 10b disposed so as to be capable of moving relative to the stationary block 9 in the direction indicated by the arrow a, and a heating controller 12 designed to be capable of moving in the direction indicated by the arrow b, as well as in the direction indicated by the arrow a. A positive electrode 12a and a negative electrode 12b protrude from the controller 12.

A die 21 acting as a correcting device is mounted on the wire-laying machine 8. This die is operated under light-load conditions and serves to correct deformation of the ultrathin metal wires 4 for the probe pins, the deformation being caused during winding on the bobbin 14. The die 21 is mounted between the delivering portion of the bobbin 14 and the clamping device 10a.

Figure 7A:
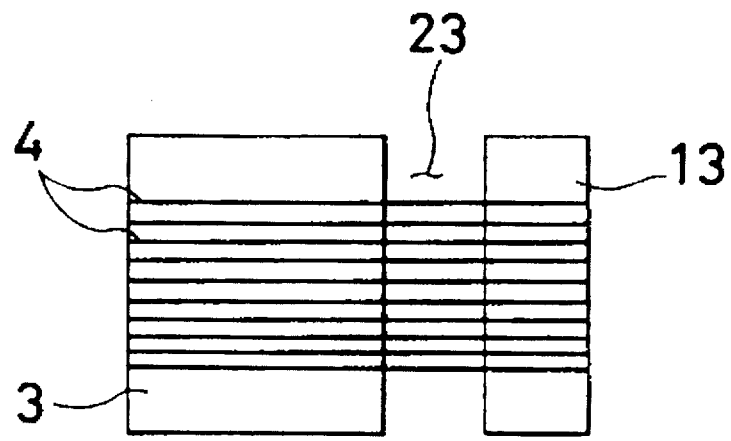
FIGS. 7a and 7b are diagrams showing two bases on which wires have been laid by the probe unit-manufacturing method according to the invention.
Figure 7B:
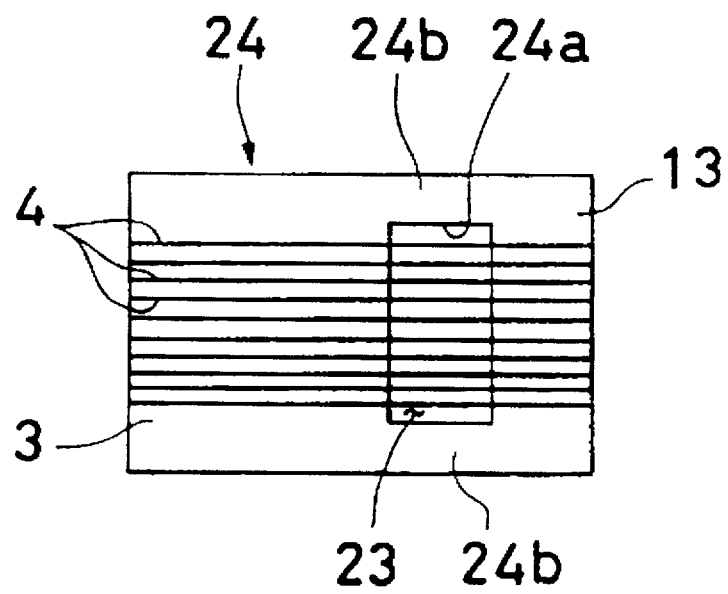

Then, two bases 3 and 13 used for the wire-laying operation in the third step are arranged with a desired space 23 therebetween as shown in FIG. 7(a). Thus, preparations are made. The base 3 is probe fore mentioned base 3 of the probe unit 1, the base 3 being made of a thermoplastic resin. The base 13 is used to maintain the direction in which a tension is applied to each ultrathin metal wire 4 for a probe pin when a bending operation is performed in the fourth step. These two bases 3 and 13 may also be disposed in the manner described now. As shown in FIG. 7(b), a window 24a conforming to the space 23 is formed in each mother support 24. Both fringes 24b forming the window 24a are severed before the bending operation is carried out in the fourth step.

The plural bases 3 and 13 or the mother supports 24 are juxtaposed on the stationary block 9 of the wire-laying machine 8 shown in FIG. 6. The bases or supports are fixed with screws. In the figure, the mother supports 24 are arrayed. Thereafter, the bobbin 14 on which the ultrathin metal wire 4 for a probe pin have been wound is set on the wire-laying machine 8. The wire is passed through the die 21 and between the clamping devices 10a and 10b. The clamping device 10a applies a tension to the wire 4 so that it may be held in tension.

Then, the clamping devices 10a and 10b are moved in the direction indicated by a to place the ultrathin metal wire 4 for the probe pin in the grooves (FIG. 3) which are formed in given positions in the mother supports 24 and pass over the windows 24a in the mother supports 24. The electrodes 12a and 12b for the heating controller 12 are energized to heat the metal wire 4 for the probe pin to, for example 180°–220° C., and the wire is pushed. Under this condition, if the heating controller 12 is moved in the direction indicated by b along the ultrathin metal wire 4 for the probe pin, then those portions of the mother supports 24 against which the wire 4 bears are melted. The wire 4 is buried in the grooves in the mother supports 24 while crossing the windows 24a, whereby the wire is secured there. Diametrically about half of the metal wire 4 secured in the mother supports 24 is buried in the grooves in the mother supports 24; the remaining portion is exposed from the mother supports 24.

After the single wire has been laid in this way, the clamping devices 10a and 10b are caused to move a given pitch. Then, a second wire is laid. These wire-laying operations are repeated to bury 80 to 300 ultrathin metal wires 4 for probe pins. Thereafter, the wires 4 are cut at both fringes of each mother support 24. In this way, the state shown in FIG. 7(b) is obtained. Where the above-described wire-laying operations are carried out, prepregs in which numerous ultrathin metal wires 4 for probe pins are arranged at a given pitch may be prepared, and these prepregs may be buried at the same time.

If the ultrathin metal wires 4 for probe pins are secured in the regularly spaced grooves in the supports as shown in FIG. 3, then the pitch between the wires 4 can be made accurate.

In the fourth step, the bending operation for forming each probe pin is carried out in a position where the existence of the ends of the bases 3 does not hinder the operation, i.e., in the space 23 between the two bases 3 and 13. In the fourth step, the mother supports 24 (FIG. 7(b)) in which the wires have been laid are set in the molding machine for molding the probe pins. The molding machine comprises hydraulically or pneumatically operated first through third mold members 15a, 15b, and 15c, respectively, and a heater for heating these mold members 15a–15c, as shown in FIG. 8. These mold members 15a–15c hold each metal wire 4 for a probe pin between them and bend the wire.

The surface of each mother support 24 on the sides of the holding bases 13 and the surfaces of the mother supports 24 on the sides of the bases 3 of thermosetting resin are held by the molding machine. Both fringes 24b of the windows 24a in the mother supports 24 are severed to divide the mother supports into the bases 3 and 13. In this manner, the state shown in FIG. 7(a) is obtained. Subsequently, the thermosetting resin bases 3 are secured. The holding bases 13 are pulled in the direction to open the space 23. Thus, the ultrathin metal wire 4 for a probe pin is located between the bases 3 and 13 and maintained in tension. Then, the wire 4 between the bases 3 and 13 is heated below 500° C. by a separately mounted heater such as a burner, an infrared light source, a laser, or the like. This removes the stress remaining in the wire 4 and improves the straightness after the wire is released from the tension. As a result, the probe pin formed after the bending operation is prevented from bending or twisting. The error in the accuracy of the pitch between the probe pins is improved by about 10 µm compared with the error produced where no heating is done.

Then, a bending step using the mold members shown in FIG. 8 is started. The mold members 15a and 15b are used to form the bent portion 4c and the inclined portion 4b. The bent portion 4c is located on an extension of the straight portion 4a of each ultrathin metal wire 4 for a probe pin, protrudes outwardly from the bases 3, and is bent toward the inspected surface of the object to be inspected. The inclined portion 4b is bent from the bent portion 4c toward the inspected surface of the inspected object outwardly of the bases 3. The mold member 15c serves to form the R-shaped portion 2 which extends from the front end of the inclined portion 4b outwardly of the bases 3.

The diameter of the space formed when the mold members 15a, 15b, and 15c hold the ultrathin metal wire 4 for a probe pin is set less than that of the wire 4 to produce a compressive deformation radially of the wire 4. Specifically, the diameter of the space is about 70% of the diameter of the wire 4. When a bending operation is carried out while applying a compressive force, a high tensile force can be produced in a direction perpendicular to the direction of the compression inside the cross section of the wire 4 and so the longitudinal bending of the wire 4 can be corrected. In consequence, the accuracy of the pitch between the probe pins can be reduced to within approximately ±10 μm.

Figure 8A:
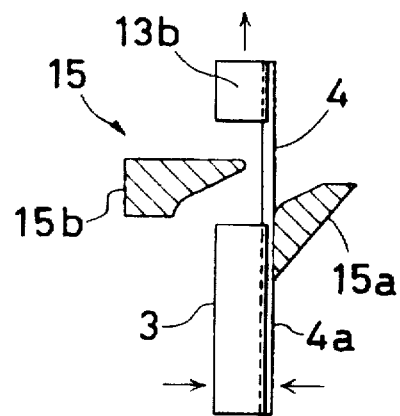
FIGS. 8a, 8b and 8c show molds used in the probe unit-manufacturing method according to the invention.
Figure 8B:
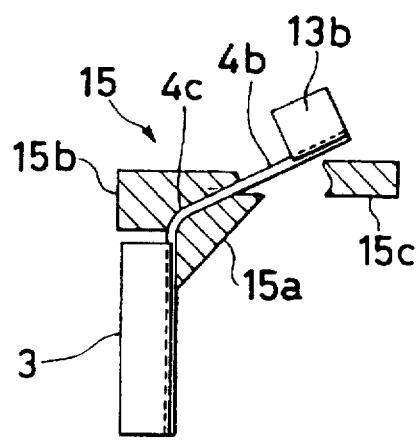
Figure 8C:
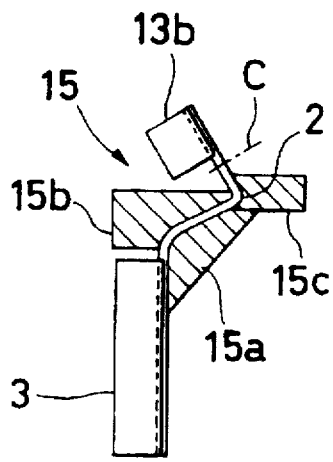

Referring to FIG. 8, the heater for the molding machine is energized to maintain the first through third mold members 15a, 15b, and 15c at a given temperature. As shown in FIG. 8(a), the first mold member 15a is brought into abutting engagement with the ultrathin metal wire 4 for a probe pin. Subsequently, as shown in FIG. 8(b), the second mold member 15b is pressed against the metal wire 4 so that the wire 4 is thrown and pushed along the curved contour of the first mold member 15a, thus forming the bent portion 4c and the inclined portion 4b. The third mold member 15c is pressed against the metal wire 4 to throw and push the wire 4 along the curved contour of the R-shaped portion of the second mold member 15b. In this way, the R-shaped portion 2 becoming one probe pin 2 is formed. In the subsequent fifth step, the front end C of the R-shaped portion 2 becoming the probe pin 2 is cut on the side of the holding base 13b, as shown in FIG. 8(c). In this way, the probe unit 1 in the present example is completed.

The reason why the mold members are maintained at the given temperature is that the metal wire 4 for a probe pin is bent while heating it. The heating permits removal of the residual stress in the metal wire 4. Also, the elastic constant can be reduced. This can weaken springback produced after the bending is completed. Furthermore, the degree of bending of each probe pin 2 can be made uniform in the direction of array. The error arising in the direction perpendicular to the direction of array of the probe pins 2 can be reduced to ±12 μm. Where no heating is done, the error is ±20 μm.

The operation and the effects of the inventive probe unit-manufacturing method are now described. In the inventive probe unit-manufacturing method, the bending operation for forming each probe pin can be carried out in a position where the bending operation is not hindered by the presence of the ends of the bases, i.e., in the space 23 between the two bases 3 and 13, because the metal wires 4 for probe pins are arranged accurately at a given pitch by the positioning grooves 20 and because the probe pins of the probe unit are formed outwardly of the bases. Therefore, accurate bending operations can be performed while exactly assuring the given pitch between the conductive interconnect-bearing portions of the R-shaped portions becoming the probe pins. For example, the metal ultrathin wires 4 for the probe pins can be bent into a desired shape by performing any one or all of a tensioning operation, a heating operation, and a diametrical compressive deformation operation. Thus, a probe unit having R-shaped portions which become probe pins and are arranged at an accurate pitch in the positions of the conductive interconnect-bearing portions is manufactured.

As a result, even if the pitch between the probe pins is small, the pins do not interfere with each other. Consequently, the diameter of the probe pins bearing against the conductive interconnects and the pitch between the pins can be reduced.

More specifically, where the wire diameter is less than 100 μm and the pitch is less than 300 μm, a probe unit having a pitch error permissible range of less than ±20 μm can be manufactured. Where the number of the above-described pixels is 800 thousands, the required pitch between two adjacent probe pins 2 is 150 μm. In the present example, this pitch can be accomplished by setting the wire diameter of the probe pins 2 to 100 μm. Where the number of pixels is 3 millions, the required pitch is about 80 μm. In the present example, this pitch can be accomplished by setting the wire diameter to 50 μm. Furthermore, in the present example, the wire diameter can be set to 20 μm. In this case, a pitch of 25 μm which is required by semiconductor logic devices can be coped with.

Figure 9A:
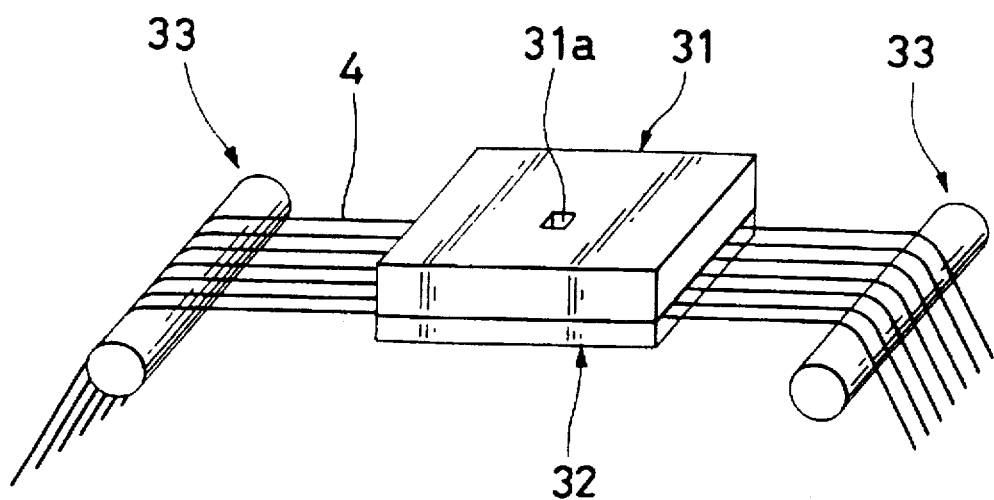
FIGS. 9a and 9b show injection molding machines for molding bases according to the probe unit-manufacturing method according to the invention.
Figure 9B:
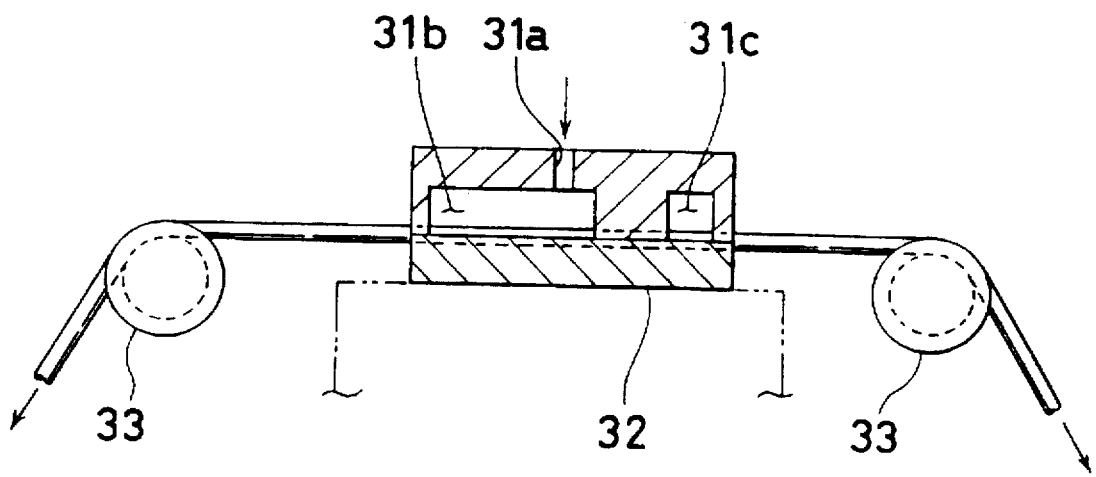

A further embodiment of the invention is described. Referring to FIG. 9, there is shown an injection molding machine having mechanical means 33 which arrays the ultrathin metal wires 4 for the probe pins at a given pitch while applying a tension in the above-described second and third steps, to improve the accuracy of the given pitch between the wires 4. Under this condition, the metal wires 4 are loaded into a mold cavity formed by metallic molds 31 and 32. Then, a resin is injected into the mold cavity to mold the resinous bases. At least a part of each of the metal wires 4 is firmly mounted on the resinous bases.

The injection molding machine shown in FIG. 9 comprises the upper metallic mold 31 for molding the bases, the lower metallic mold 32 for molding the bases, and the metallic rolls 33 provided with grooves formed at the same pitch as the pitch between the ultrathin metal wires 4 for the probe pins. When the molds are closed, spaces 31b and 31c are formed by the molds to create bases corresponding to the two bases 3 and 13. In this injection molding machine, each ultrathin metal wire 4 for a probe pin is fitted in the corresponding one of the grooves in the rolls 33 and tightened. Under this condition, the upper and lower molds are closed while holding the wire 4 from above and below. A resin is injected through an injection port 31a and caused to cure. The bases are finished in such a way that the ultrathin metal wires 4 are firmly secured to the bases at a given pitch.

Figure 10:
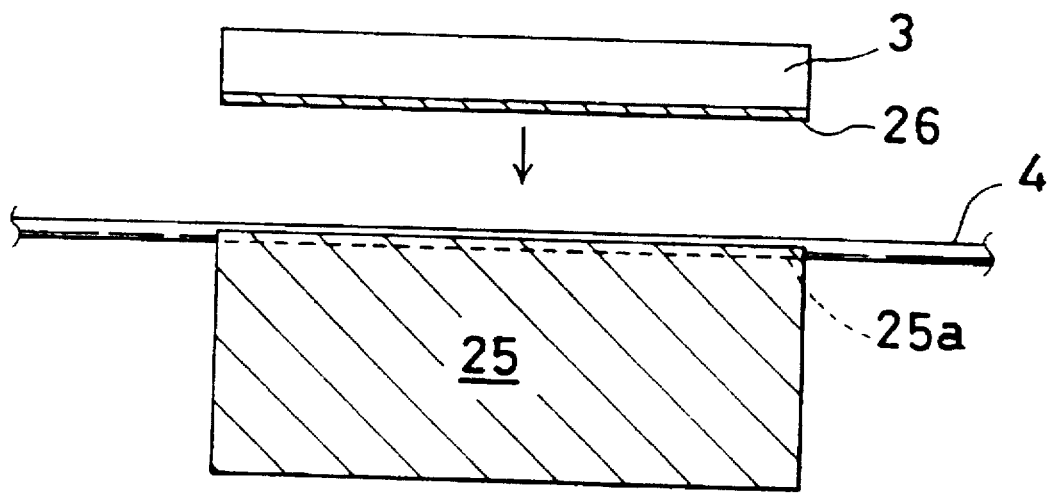
FIG. 10 is a cross-sectional view of a machine for firmly securing ultrathin metal wires for probe pins to a base in another probe unit-manufacturing method according to the invention.
Figure 11:
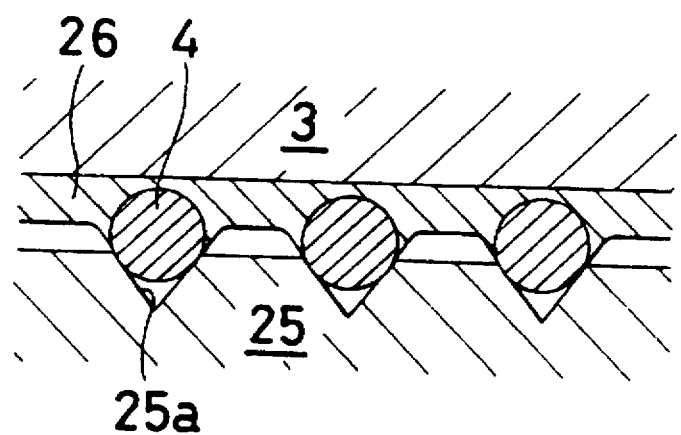
FIG. 11 is a cross-sectional view of ultrathin metal wires for probe pins, the wires being firmly secured to the base by the machine shown in FIG. 10.

A machine shown in FIG. 10 arrays the ultrathin metal wires 4 for the probe pins on an array base 25 at a given pitch while applying a tension in the above-described second and third steps, to improve the accuracy of the given pitch between the wires 4, the array base 25 being provided with grooves 25a spaced from each other at the same pitch as the given pitch between the wires 4. A base in the form of a rectangular plate is pressed against the arrayed metal wires 4 via adhesive 26. The surface on which this rectangular base makes contact with the wires 4 is a flat plane. In this way, the wires 4 are bonded to the bases 3. FIG. 11 shows cross sections of some ultrathin metal wires 4 bonded to the bases 3 by the machine shown in FIG. 10.

If the second and third steps described above are carried out by the method described in connection with FIG. 9 or 10, then the error of the pitch at which the metal wires 4 are arranged is within the accuracy obtained where either the metallic rolls 33 or the array base 25 is provided with grooves. This improves the accuracy of the pitch when the metal wires 4 for the probe pins are firmly secured. Especially, where the method already described in conjunction with FIG. 10 is executed, the contact surface that the base forms with each metal wire 4 is flat. Also, the shape of the base is simple. Furthermore, the metal wires 4 can be easily bonded since it is only necessary to push the wires via the adhesive 26. In the method illustrated in FIG. 10, the material of the base is not limited to a thermoplastic resin. Glass, ceramics, and other insulating materials can also be used.

Where a base is molded by transferring grooves from base-forming molds having protrusions as described previously in connection with FIG. 3, the error of the accuracy of the pitch between the arrayed metal wires 4 contains a primary error produced when the protrusions are formed on the molds and a secondary error produced when the grooves are transferred to the molds. Hence, where the second and third steps are carried out by the method illustrated in FIGS. 9 or 10, the error contained in the pitch between the arranged wires 4 is reduced.

FIGS. 12–15 illustrate a manufacturing method in which the fourth step, or a bending operation, is effected in such a way that two bases 3 are symmetrical when viewed from a side within a given space 23. The bases shown in FIG. 12 correspond to the bases shown in FIG. 7 and comprise two bases 3 which are symmetrical horizontally. FIG. 13 shows a molding machine 27. FIG. 13(a) is a side elevation of the machine. FIG. 13(b) is a side elevation of the machine. Parts 27a, 27b, and 27c correspond to the first through third mold members 15a, 15b, and 15c, respectively. These are so shaped that a bending operation is carried out symmetrically horizontally as viewed from a side of the bases 3. Also shown are movable bases 28, rails 29 for the movable bases, tension-applying springs 34, and holding plates 35.

Figure 12A:
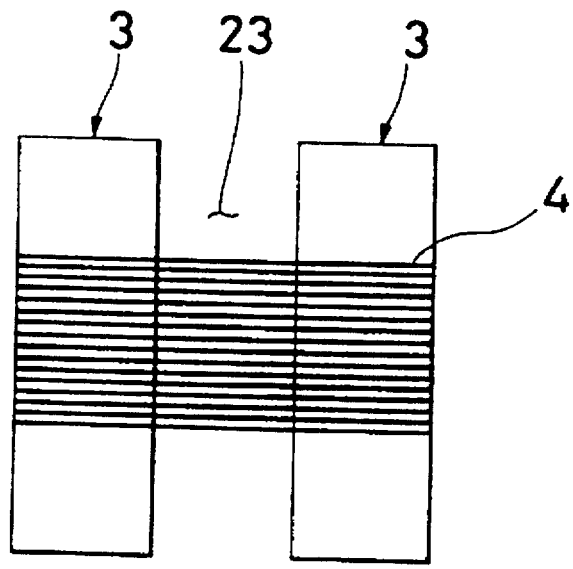
FIGS. 12a and 12b show two bases on which wires have been laid by a further probe unit-manufacturing method according to the invention.
Figure 12B:
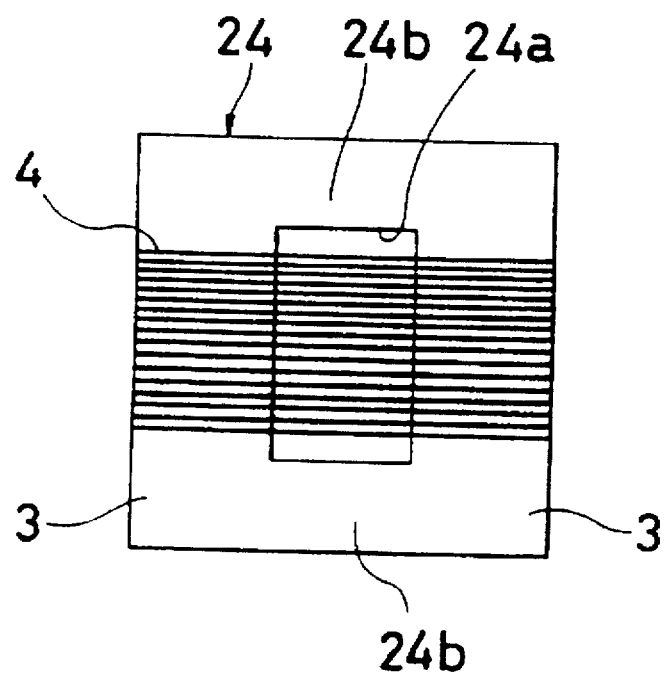
Figure 14A:
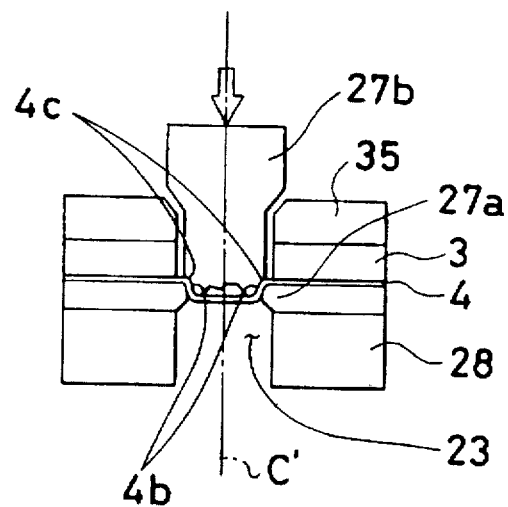
FIGS. 14a, 14b and 14c illustrate the operation of the machine shown in FIG. 13.
Figure 14B:
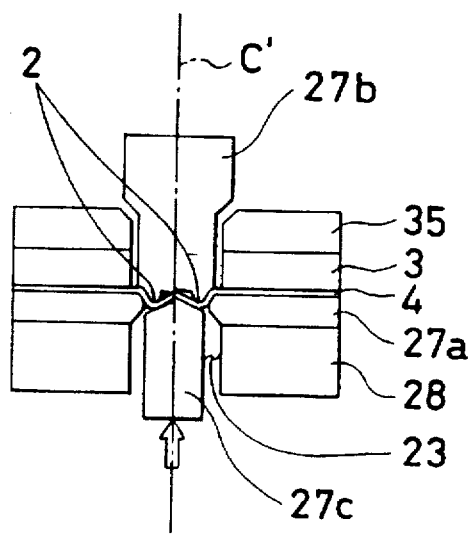
Figure 14C:
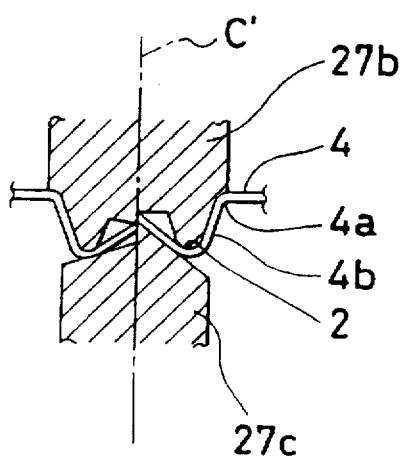

The operation of the molding machine 27 is next described. The two bases 3 prepared as shown in FIG. 12(a) are held between two pairs of movable bases 28 and holding plates 35, as shown in FIG. 13. In FIG. 14, the heater of the molding machine 27 is turned on, and the first through third mold members 27a, 27b, and 27c are maintained at a desired temperature. Then, as shown in FIG. 14(a), each ultrathin wire 4 for a probe pin is thrown and pushed along the curved contour of the first mold member 27a by the second mold member 27b to form the bent portion 4c and the inclined portion 4b. Then, the wire 4 is thrown and pushed along the R-shaped contour of the second mold member 27b by the third mold member 27c to form the R-shaped portion 2 becoming one probe pin 2. Thereafter, in the fifth step, the metal wire 4 is cut at the front end of the R-shaped portion 2 forming the probe pin 2, i.e., on the horizontal symmetrical line C', as shown in FIG. 14(c). As a result, two probe units 1 of the present embodiment are fabricated at the same time.

If the bending operation, or the fourth step, is carried out such that the side surfaces of the bases 3 are symmetrical inside the space 23, and if the metal wire 4 is cut at the front end of the R-shaped portion 2 forming the probe pin 2, i.e., on the horizontal symmetrical line C' in the fifth step, then two probe units 1 of the present embodiment are obtained concurrently. This doubles the manufacturing efficiency and saves the metal wires 4 for probe pins.

Figure 15:
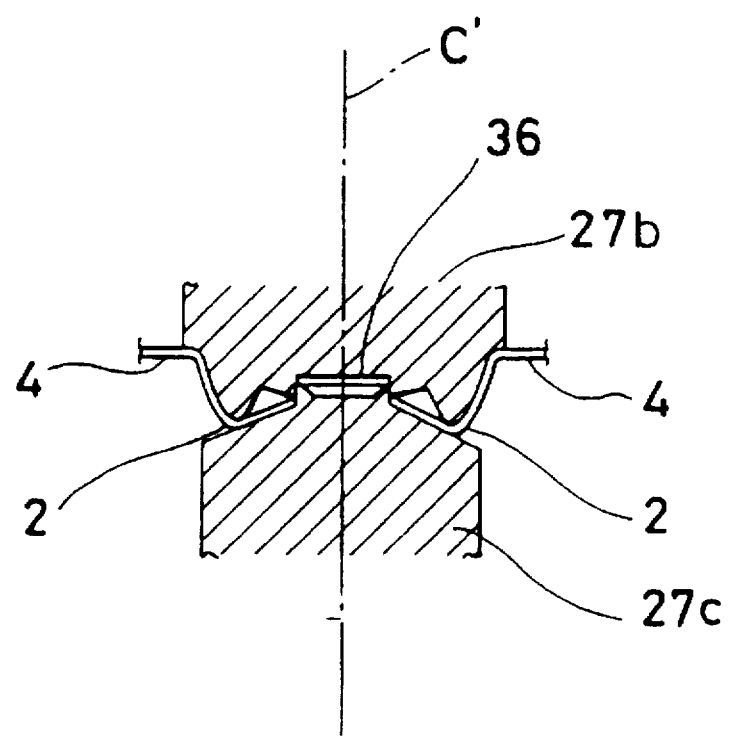
FIG. 15 is a cross-sectional view illustrating the operation of molds used in a yet other probe unit-manufacturing method according to the invention.

FIG. 15 shows an example in which a straight portion 36 is formed between the front ends of the R-shaped portions 2 forming the right and left probe pins 2, respectively. The provision of this straight portion 36 makes it possible to cut the wire 4 in the fifth step with greater ease and greater accuracy.

Figure 16:
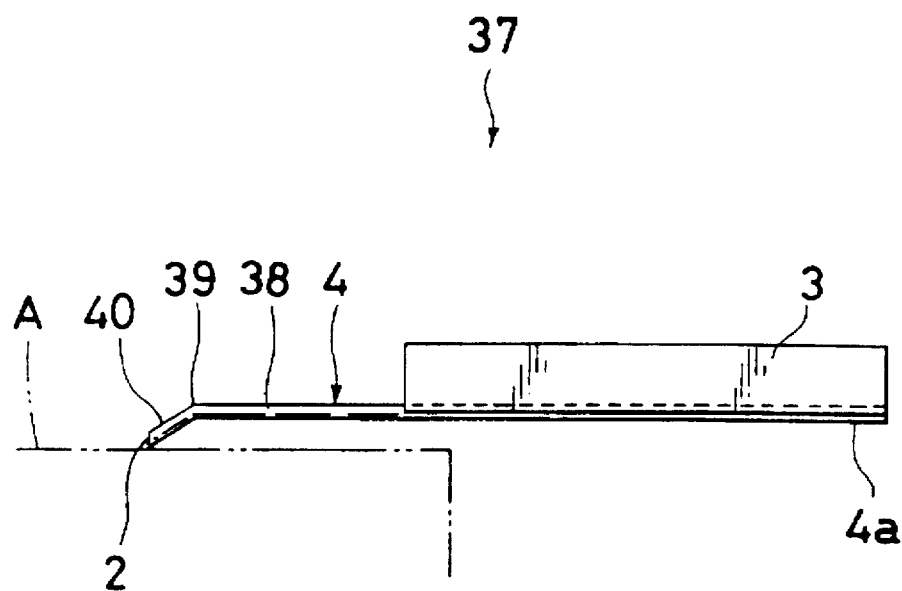
FIGS. 16a and 16b show a further probe unit according to the invention.
Figure 16:
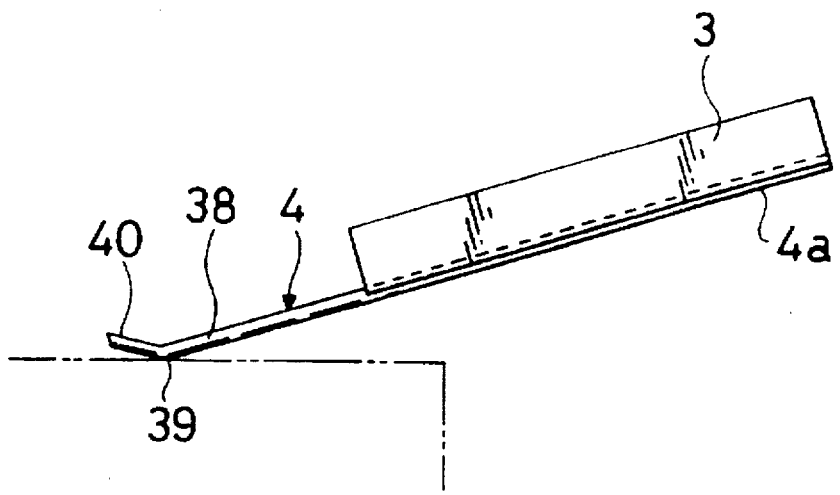

As described already, in order to enhance the accuracy of the pitch between the probe pins in the positions of the conductive interconnect-bearing portions, it is necessary that the ultrathin metal wires 4 be arranged at an accurate pitch and that each wire 4 be bent more accurately in the fourth step. Accordingly, where higher accuracy is required, a probe unit 37 as shown in FIG. 16 is optimally used. In particular, the probe unit 37 is equipped with ultrathin metal wires 4 for probe pins. This unit is characterized in that the wires are hardly bent.

In FIG. 16(a), the probe unit 37 comprises a base 3 in the form of a rectangular plate and a plurality of ultrathin metal wires 4 for probe pins. Parts of the metal wires are firmly mounted to the base 3 at a given pitch. Each wire 4 comprises a straight portion 4a firmly mounted to the base 3, a swelling portion 38 located on an extension of the straight portion and swelling straight outwardly from the base, a bent portion 39 bent toward an inspected surface A of an object to be inspected from the front end of the swelling portion 38, and an inclined portion 40 inclined outwardly of the base from the bent portion 39 toward the inspected surface A of the inspected object. The front end of the inclined portion 40 forms a probe pin 2 bearing against the inspected surface A of the inspected object.

In FIG. 16(b), a bent portion 39 bent from the front end of the swelling portion 38 away from the inspected surface A of the inspected object and an inclined portion 40 inclined from the bent portion 39 away from the inspected surface A outwardly of the base are formed. The bent portion 39 forms the probe pin 2 bearing against the inspected surface A of the inspected object.

In the case of FIG. 16(a), the probe unit 37 of the structure described above has the ultrathin metal wires 4 for probe pins, each wire 4 having the swelling portion 38, the bent portion 39, and the inclined portion 40 which together cooperate to impart self-resilience to the probe pin 2. In the case of FIG. 16(b), the swelling portion 38 and the bent portion 39 together impart self-resilience to the probe pin 2. Only one bending operation is carried out when the bent portion 39 is formed to thereby form the probe pin 2. Obviously, the pitch between the successive probe pins 2 is improved over the pitch obtained in the case of the probe unit 1 shown in FIG. 1. Therefore, if each bent portion 39 is bent to form the probe pins 2 after the ultrathin metal wires 4 are arranged at a given pitch and secured to the base by the method illustrated in FIGS. 10 and 11, then the accuracy of the pitch between the probe pins 2 in the positions of the conductive interconnect-bearing portions is enhanced further. In addition, the probe unit is made simple in structure. Also, this probe unit is easy to manufacture.

The probe unit 37 of this structure is manufactured in the fourth step for forming the probe pins. In particular, the swelling portion of each ultrathin metal wire 4 extending straight into the space 23 from the base 3 is bent from its front end toward the inspected surface of the inspected object or away from the inspected surface outwardly of the base 3 inside the space 23 shown in FIG. 7 to form the bent portion 39 and the inclined portion 40.

Figure 17:
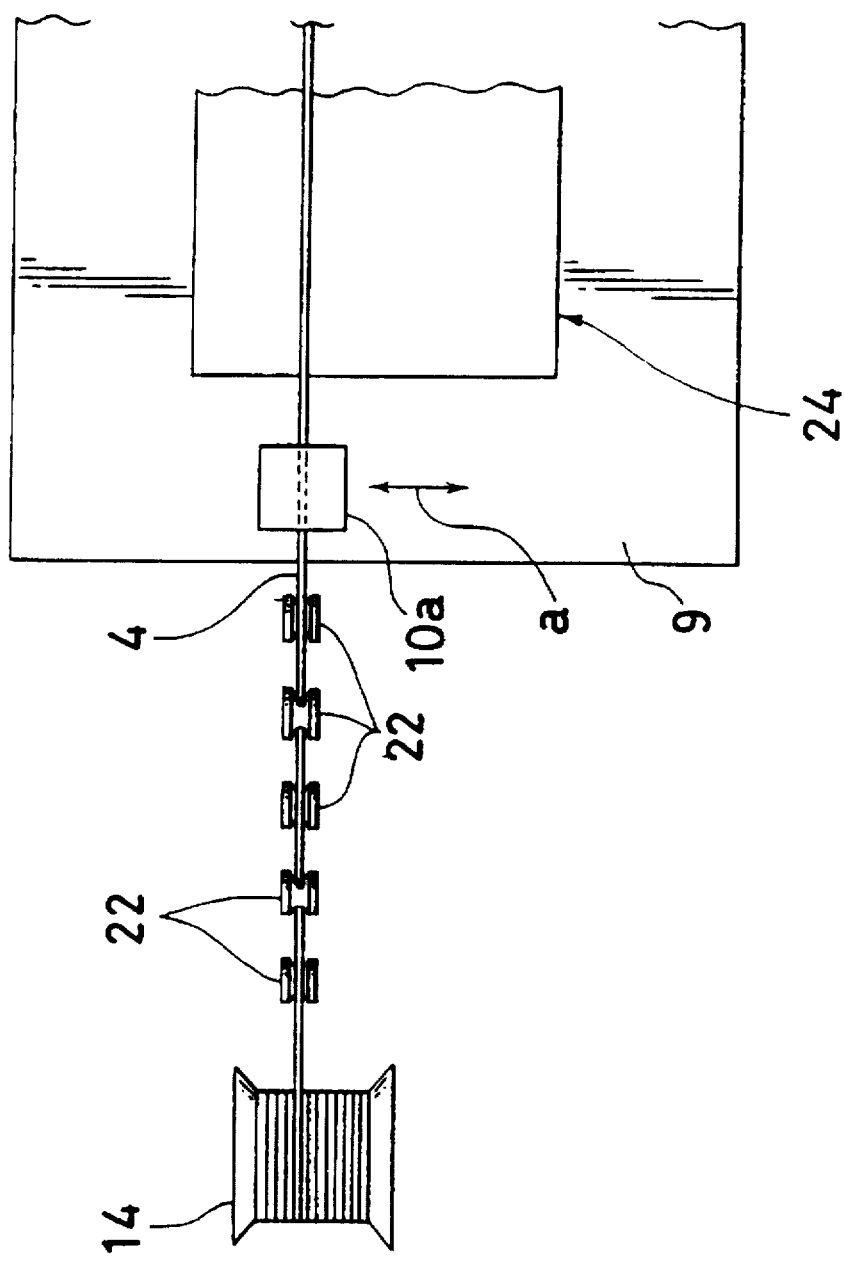
FIG. 17 is a side elevation of a machine for correcting ultrathin metal wires for probe pins, the machine being used in an additional probe unit-manufacturing method according to the invention.

FIG. 17 shows other example of the correcting device 21 already described in connection with FIG. 6. A plurality of rollers 22 are arranged in a line. The ultrathin metal wires 4 for the probe pins are moved so as to pass over and under each roller 22 alternately, thus correcting deformation.

Figure 18:
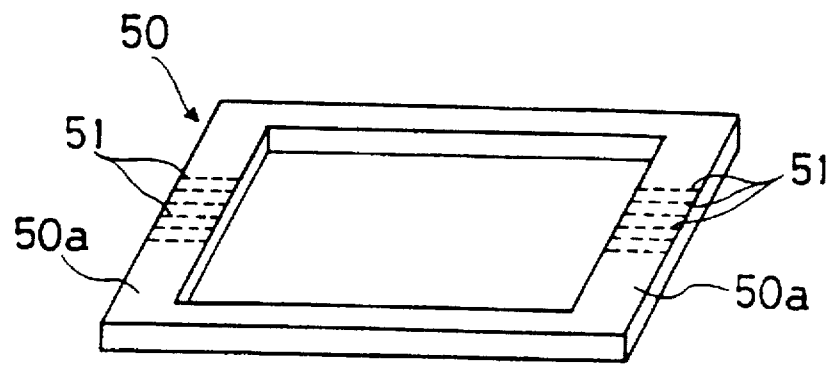
FIGS. 18a, 18b and 18c illustrate other methods of laying wires in a method of manufacturing a probe unit according to the invention.
Figure 18:
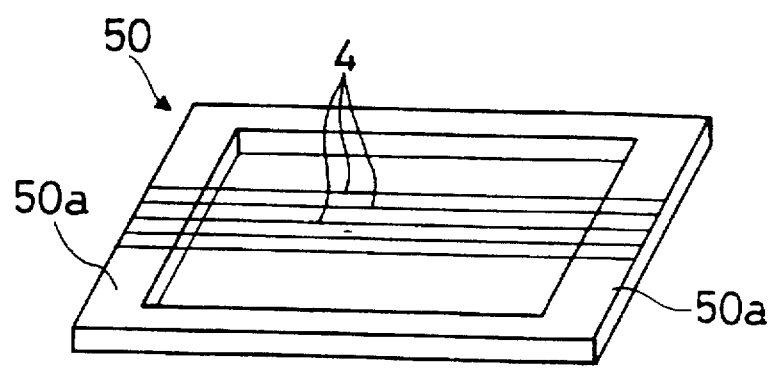
Figure 18:
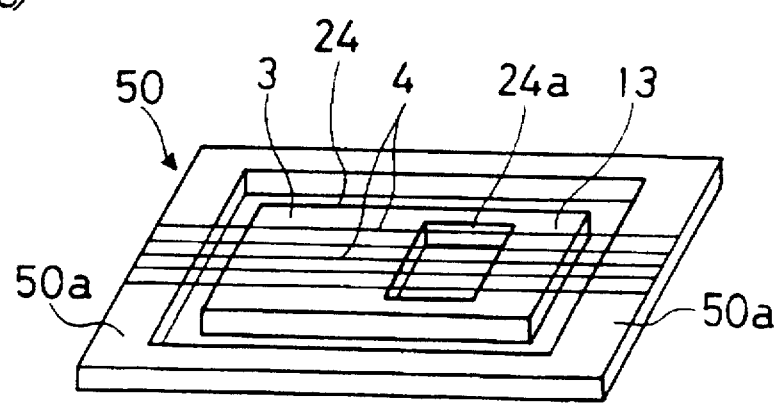

FIG. 18 illustrates other methods of laying wires in the third step of the probe unit-manufacturing method. A wire-laying device 50 is used. As shown in FIG. 18(a), this wire-laying device 50 comprises a frame provided with a window capable of receiving the mother support 24 or the two bases 3. Grooves 51 are formed in the left and right portions 50a of the frame 50. The grooves 51 permit the ultrathin metal wires 4 for the probe pins to be arranged at a given pitch so as to cross the window. The wires 4 are temporarily fastened along the grooves 51 so as to pass across the window as shown in FIG. 18(b). The wires are laid on the frame 50 by the wire-laying device 8 shown in FIG. 6 or other device. This wire-laying operation provides a considerably high pitch accuracy. Then, as shown in FIG. 18(c), when the mother support 24 or the two bases 3 are inserted in the window in the frame 50, the ultrathin metal wires 4 stretched across the frame 50 are smoothly and accurately fitted into the grooves 20 formed at a given pitch either in the mother support 24 or in the two bases 3. As a result, the wires are arranged at an improved pitch. Under this condition, the wires 4 are bonded either to the mother support 24 or to the two bases 3. The frame 50 is fabricated from polycarbonate or other thermoplastic resin having a small coefficient of linear thermal expansion by injection molding.

If the ultrathin metal wires 4 for the probe pins are arranged in the grooves 20 in the bases and firmly secured after the wires 4 are temporarily fastened to the frame 50 at a given pitch as described above, the pitch error of ±20 μm produced by the frame 50 can be reduced to within ±2 to 5 μm.

Figure 19:
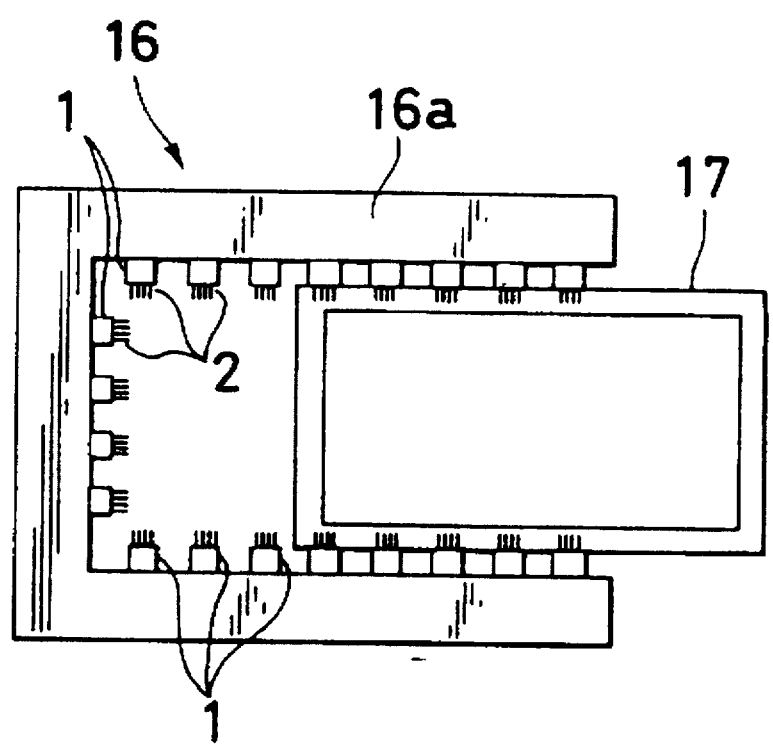
FIG. 19 is a fragmentary side elevation of an inspection machine to which a probe unit according to the invention has been attached.

FIG. 19 shows an inspection apparatus to which the probe unit 1 has been attached. The probe unit 1 manufactured by performing the steps described above has the conductive interconnects bonded to the tape by TAB as described above. These interconnects are bonded to the straight portions 4a of the probe pins 2 shown in FIG. 1 by thermocompression. Then, the probe unit 1 is inserted into a frame member 16a of an inspection apparatus 16 shown in FIG. 19 and mounted to the apparatus. The inspection apparatus moves the frame member 16a to the inspected surface of a liquid-crystal substrate 17 which has been moved into a desired position. Then, the apparatus causes the probe pins 2 of the probe unit 1 to bear against the conductive interconnects. Under this condition, an electrical conduction test is performed.

In the above embodiments, a probe unit used in a liquid-crystal display is taken as an example. The novel probe unit and the novel method of fabricating it are not limited to such a probe unit but can be used for inspection of electrical conduction of conductive interconnects formed at an increasing density on a semiconductor integrated circuit or the like. In addition, the ultrathin metal wires for the probe pins can also be made of stainless steel or piano wire.

INDUSTRIAL APPLICABILITY

As described thus far, in the inventive probe unit and manufacturing method, ultrathin metal wires for probe pins are arranged at a given pitch accurately, and the probe pins are formed by more accurate bending. Consequently, the diameter of the wires and the pitch between them can be reduced. In this way, the invention is adapted for electrical conduction tests of conductive interconnects formed at a high density on a liquid-crystal display, a semiconductor integrated circuit, and so on.

We claim:

1. A method of manufacturing a probe unit, comprising the steps of:

forming a number of ultra-thin metal wires for probe pins out of metal wire rods;

forming two bases, each taking the form of a rectangular plate;

disposing said two bases with a space therebetween;

laying said metal wires across said space at a given pitch and firmly securing said wires to said bases;

then bending said metal wires protruding into said space outwardly of said bases to form said probe pins; and separating said metal wires secured to said two bases at front ends of said bent probe pins.

2. A method of manufacturing a probe unit as set forth in claim 1, wherein said step of bending said metal wires protruding from said base into said space consists of: bending said ultrathin metal wires toward said inspected surface of said object to be inspected within said space to form a bent portion and an inclined portion extending from said bent portion outwardly of said bases; and bending said metal wires from front ends of said inclined portions outwardly of said bases to form R-shaped portions.

3. A method of manufacturing a probe unit as set forth in claim 1, wherein said step of bending said metal wires protruding from said bases into said space consists of bending said metal wires toward said inspected surface of said inspected object or away from said inspected surface outwardly of said bases within said space to form bent portions and inclined portions, said swelling portions swelling straight into said space from said bases, whereby forming said probe pins.

4. A method of manufacturing a probe unit as set forth in claim 1, wherein said ultrathin metal wires for the probe pins have a diameter of less than 100 μm and are arranged at a pitch of less than 300 μm, and wherein said pitch has a permissible error range of less than ±20 μm.

5. A method of manufacturing a probe unit as set forth in claim 1, wherein said step of bending said metal wires protruding from said bases into said space is carried out in such a way that left and right sides of said bases are symmetrical within said space, and wherein two probe units are obtained when said separation at the front ends of said probe pins is completed.

6. A method of manufacturing a probe unit as set forth in claim 1, wherein when said step of bending said metal wires protruding from said bases into said space is being carried out, said metal wires are bent into a desired shape by performing any one or all of a tensioning operation, a heating operation, and a diametrical compressive deformation operation.

7. A method of manufacturing a probe unit as set forth in claim 1, wherein said step of forming said two bases consists of molding said bases with molds having a number of protrusions such that said bases are provided with a number of grooves corresponding to said protrusions in its surface opposite to said inspected surface of said object to be inspected, and wherein said ultrathin metal wires for the probe pins are firmly secured within said grooves during execution of said step of laying said metal wires across said space at a given pitch and firmly securing said wires.

8. A method of manufacturing a probe unit as set forth in claim 1 wherein said step of forming two bases, each taking the form of a rectangular plate, said step of disposing said two bases with said space therebetween, and said step of laying said metal wires across said space at a given pitch and firmly securing said wires are carried out by means of an injection molding machine which arrays said metal wires at a given pitch while applying a tension by a mechanical means, loads the wires into a mold cavity, injects a resin into said mold cavity to mold said bases out of said resin, and firmly secures at least a part of each of said metal wires to said resinous bases.

9. A method of manufacturing a probe unit as set forth in claim 8, wherein said ultrathin metal wires loaded into said mold cavity are prepregs previously arrayed at the given pitch.

10. A method of manufacturing a probe unit as set forth in claim 8, wherein said loaded resin is a liquid thermosetting resin, and wherein said bases are molded out of said resin under a low pressure.

11. A method of manufacturing a probe unit as set forth in claim 1, wherein in said step of forming two bases, each taking the form of a rectangular plate, in said step of disposing said two bases with said space therebetween, and in said step of laying said metal wires across said space at a given pitch and firmly securing said wires, an array base provided with grooves spaced from each other at the same pitch as the pitch between said metal wires is prepared, said ultra-thin metal wires are arrayed on said array base while applying a tension to said wires, said bases, each taking the form of a rectangular plate are pressed against said metal wires via an adhesive such that said bases make contact with said wires in a flat plane, and said wires are firmly secured to said bases.

12. A method of manufacturing a probe unit as set forth in claim 1, wherein said step of laying said metal wires across said space at a given pitch and firmly securing said wires consists of pushing those portions of said metal wires which bear against said bases while heating them to thereby firmly secure at least a part of each of said metal wires to said bases.

13. A method of manufacturing a probe unit as set forth in claim 1, wherein said step of forming a number of ultrathin metal wires for probe pins out of metal wire rods includes a step of heating said formed metal wires while applying a tension to said wires to straighten said wires.

14. A method of manufacturing a probe unit as set forth in claim 1, wherein said step of disposing said two bases with said space therebetween consists of preparing a frame having a window capable of receiving said bases, previously arraying said metal wires at a given pitch such that said wires cross said window, inserting said bases into said window, and arranging said wires at said given pitch.

15. A method of manufacturing a probe unit, comprising the steps of:
   forming a number of ultra-thin metal wires for probe pins out of metal wire rods;
   forming a mother support provided with a window forming a space;
   laying said metal wires across said space at a given pitch and firmly securing said wires to said mother support;
   dividing said mother support into two bases with said space therebetween;
   then bending said metal wires protruding into said space outwardly of said bases to form said probe pins; and
   separating said metal wires secured to said two bases at front ends of said bent probe pins.

16. A method of manufacturing a probe unit as set forth in claim 15, wherein said step of bending said metal wires protruding from said base into said space consists of: bending said ultra-thin metal wires toward said inspected surface of said object to be inspected within said space to form a bent portion and an inclined portion extending from said bent portion outwardly of said bases; and bending said metal wires from front ends of said inclined portions outwardly of said bases to form R-shaped portions.

17. A method of manufacturing a probe unit as set forth in claim 15, wherein said step of bending said metal wires protruding from said bases into said space consists of bending said metal wires toward said inspected surface of said inspected object or away from said inspected surface outwardly of said bases within said space to form bent portions and inclined portions, said swelling portions swelling straight into said space from said bases, whereby forming said probe pins.

18. A method of manufacturing a probe unit as set forth in claim 15, wherein said ultra-thin metal wires for the probe pins have a diameter of less than 100 µm and are arranged at a pitch of less than 300 µm, and wherein said pitch has a permissible error range of less than ±20 µm.

19. A method of manufacturing a probe unit as set forth in claim 15, wherein said step of bending said metal wires protruding from said bases into said space is carried out in such a way that left and right sides of said bases are symmetrical within said space, and wherein two probe units are obtained when said separation at the front ends of said probe pins is completed.

20. A method of manufacturing a probe unit as set forth in claim 15, wherein when said step of bending said metal wires protruding from said bases into said space is being carried out, said metal wires are bent into a desired shape by performing at least one of a tensioning operation, a heating operation, and a diametrical compressive deformation operation.

21. A method of manufacturing a probe unit as set forth in claim 15, wherein said step of forming said mother support consists of molding said bases with molds having a number of protrusions such that said mother support is provided with a number of grooves corresponding to said protrusions in its surface opposite to said inspected surface of said object to be inspected, and wherein said ultra-thin metal wires for the probe pins are firmly secured within said grooves during execution of said step of laying said metal wires across said space at a given pitch and firmly securing said wires.

22. A method of manufacturing a probe unit as set forth in claim 15 wherein said step of forming a mother support provided with a window forming a space and said step of laying said metal wires across said space at a given pitch and firmly securing said wires are carried out by means of an injection molding machine which arrays said metal wires at a given pitch while applying a tension by a mechanical means, loads the wires into a mold cavity, injects a resin into said mold cavity to mold said mother support out of said resin, and firmly secures at least a part of each of said metal wires to said resinous bases.

23. A method of manufacturing a probe unit as set forth in claim 22, wherein said ultra-thin metal wires loaded into said mold cavity are prepregs previously arrayed at the given pitch.

24. A method of manufacturing a probe unit as set forth in claim 22, wherein said loaded resin is a liquid thermosetting resin, and wherein said bases are molded out of said resin under a low pressure.

25. A method of manufacturing a probe unit as set forth in claim 15, wherein in said step of forming a mother support provided with a window forming a space and in said step of laying said metal wires across said space at a given pitch and firmly securing said wires, an array base provided with grooves spaced from each other at the same pitch as the pitch between said metal wires is prepared, said ultra-thin metal wires are arrayed on said array base while applying a tension to said wires, the mother support is pressed against said metal wires via an adhesive such that said mother support makes contact with said wires in a flat plane, and said wires are firmly secured to said mother support.

26. A method of manufacturing a probe unit as set forth in claim 15, wherein said step of laying said metal wires across said space at a given pitch and firmly securing said wires consists of pushing those portions of said metal wires which bear against said mother support while heating them to thereby firmly secure at least a part of each of said metal wires to said mother support.

27. A method of manufacturing a probe unit as set forth in claim 15, wherein said step of forming a number of ultra-thin metal wires for probe pins out of metal wire rods includes a step of heating said formed metal wires while applying a tension to said wires to straighten said wires.

28. A method of manufacturing a probe unit as set forth in claim 15, wherein said step of laying said metal wires across said space at a given pitch and firmly securing said wires to said mother support consists of preparing a frame having a second window capable of receiving said mother support, previously arraying said metal wires at a given pitch such that said wires cross said second window, inserting said mother support into said second window, and arranging said wires at said given pitch.

* * * * *

UNITED STATES PATENT AND TRADEMARK OFFICE
CERTIFICATE OF CORRECTION

PATENT NO. : 5,673,477
DATED : October 7, 1997
INVENTOR(S) : Shigeo HATTORI, et al.

It is certified that error appears in the above-indentified patent and that said Letters Patent is hereby corrected as shown below:

On the title page, item [62], the PCT filing date should be:

--Oct. 12, 1993--

Signed and Sealed this

Sixth Day of January, 1998

Attest:

Attesting Officer

BRUCE LEHMAN

Commissioner of Patents and Trademarks